United States Patent
Sato et al.

(10) Patent No.: US 6,420,271 B2
(45) Date of Patent: Jul. 16, 2002

(54) METHOD OF FORMING A PATTERN

(75) Inventors: Yasuhiko Sato, Yokohama; Eishi Shiobara, Inagi; Motoyuki Sato, Yokohama; Yasunobu Onishi, Yokohama; Hiroshi Tomita, Yokohama; Tokuhisa Ohiwa, Kawasaki; Junko Ohuchi, Yokohama; Hisataka Hayashi, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/814,839

(22) Filed: Mar. 23, 2001

(30) Foreign Application Priority Data

Mar. 24, 2000 (JP) ........................................ 2000-085108

(51) Int. Cl.$^7$ .......................................... H01L 21/4763
(52) U.S. Cl. ........................................................ 438/700
(58) Field of Search ................................ 438/644, 761, 438/770, 790

(56) References Cited

U.S. PATENT DOCUMENTS 6,084,029 A * 7/2000 McGee ........................ 525/66
6,117,536 A * 9/2000 Poutasse ................... 428/301.1
6,248,401 B1 * 6/2001 Chiang et al. ........... 427/255.7

FOREIGN PATENT DOCUMENTS

JP 6-53134 2/1994

OTHER PUBLICATIONS

Lin, "Multilayer Resist Systems and Processing," Solid State Technology (May 1983), pp. 105–112.

* cited by examiner

Primary Examiner—David Nelms
Assistant Examiner—Quoc Hoang
(74) Attorney, Agent, or Firm—Finnegan, Henderson, Farabow, Garrett, & Dunner, L.L.P.

(57) ABSTRACT

A method of forming a pattern comprising the steps of, forming a lower film on a substrate, the lower film being a film containing carbon atom at a ratio of 80 wt % or more, or a vapor phase deposition film, either applying an adhesion-promoting treatment to a surface of the lower film or forming an adhesion-promoting on the lower film, forming an intermediate film on a surface of the lower film, forming a resist film on the intermediate film, forming a resist pattern by conducting a patterning exposure of the resist film, forming an intermediate film pattern by transferring the resist pattern to the intermediate film, and forming a lower film pattern by transferring the intermediate film pattern to the lower film.

20 Claims, 4 Drawing Sheets

METHOD OF FORMING A PATTERN

CROSS-REFERENCE TO RELATED APPLICATIONS

This application is based upon and claims the benefit of priority from the prior Japanese Patent Application No. 2000-085108, filed Mar. 24, 2000, the entire contents of which are incorporated herein by reference.

BACKGROUND OF THE INVENTION

The present invention relates to a method of manufacturing a semiconductor device, and in particular to a method of forming a pattern on the surface of a semiconductor wafer substrate.

The process of manufacturing a semiconductor device comprises a number of patterning steps which are performed by depositing a plurality of materials as a processing film (i.e. film to be processed) on a silicon wafer, the resultant deposited layers being subsequently patterned into desired patterns. The patterning of these processing films is performed as follows.

First of all, generally, a photosensitive material called resist is deposited on a processing film to form a resist film, a predetermined region of which is then subjected to an exposure. Thereafter, this exposure region or non-exposure region of the resist film is removed by subjecting the resist film to a developing treatment to thereby form a resist pattern, which is then employed as an etching mask in the dry etching of the processing film.

As for the exposure light source to be employed in this exposure step, ultraviolet rays such as KrF excimer laser and ArF excimer laser are generally employed in view of enhancing the throughput. Due to the recent trend to further enhance the microfabrication in the LSI however, the resolution which is now demanded is so high that the fineness thereof is smaller than the wavelength of the ultraviolet rays, so that it now becomes difficult to sufficiently secure the exposure process tolerance (or process margin) such as the tolerance in exposure value, focus tolerance, etc. While it may be effective for the purpose of making up for this process margin to make thinner the film thickness of the resist film to thereby improve the resolution, if the film thickness of the resist film is made thinner, it will lead to another problem that it becomes difficult to secure a sufficient thickness of resist film that is required for the etching of the processing film.

In view of overcoming this problem, there is proposed a method using multi-layer resist as disclosed in Solid State Technology, 26(5), 105(1983), wherein a lower film, an intermediate film and a resist film are successively deposited on a processing film, then, a lower film pattern is formed by transferring a resist pattern via the intermediate film to the lower film, and finally, the processing film is processed using this lower film pattern as an etching mask.

According to this method, the lower film is required to be useful as an etching mask, so that the lower film is required to be constituted by a material which can be hardly sputtered and includes a large number of carbon atoms excellent in etching resistance. However, since a material having a high content of carbon atoms is poor in gas permeability, a source gas or part of the source gas tends to stay between the lower film and the intermediate film on the occasion of etching the lower film with the intermediate film pattern being used as an etching mask, thereby giving rise to the generation of phenomenon that the intermediate film tends to be expanded and ruptured. Therefore, it has been very difficult to properly work the lower film.

BRIEF SUMMARY OF THE INVENTION

An object of the present invention is to provide a method of forming a pattern, which is capable of processing the lower film without inviting the rupturing of the etching mask formed on the lower film, even if a material having a high content of carbon atoms is employed for the lower film.

According to the present invention, there is provided a method of forming a pattern comprising the steps of;
   forming a lower film on a substrate, the lower film being a film containing carbon atom at a ratio of 80 wt % or more, or a vapor phase deposition film;
   applying an adhesion-promoting treatment to a surface of the lower film;
   forming an intermediate film on a surface of the lower film on which the adhesion-promoting treatment has been applied;
   forming a resist film on the intermediate film;
   forming a resist pattern by conducting a patterning exposure of the resist film;
   forming an intermediate film pattern by transferring the resist pattern to the intermediate film; and
   forming a lower film pattern by transferring the intermediate film pattern to the lower film.

According to the present invention, there is also provided a method of forming a pattern comprising the steps of;
   forming a lower film on a substrate, the lower film being a film containing carbon atom at a ratio of 80 wt % or more, or a vapor phase deposition film;
   applying an adhesion-promoting treatment to a surface of the lower film;
   forming a resist film containing a metal atom or a semiconductor atom on a surface of the lower film on which the adhesion-promoting treatment has been applied;
   forming a resist pattern by conducting a patterning exposure of the resist film; and
   forming a lower film pattern by transferring the resist pattern to the lower film.

According to the present invention, there is also provided a method of forming a pattern comprising the steps of;
   forming a lower film on a substrate, the lower film being a film containing carbon atom at a ratio of 80 wt % or more, or a vapor phase deposition film;
   forming an adhesion-promoting film on a surface of the lower film;
   forming an intermediate film on a surface of the adhesion-promoting film;
   forming a resist film on the intermediate film;
   forming a resist pattern by conducting a patterning exposure of the resist film;
   forming an intermediate film pattern by transferring the resist pattern to the intermediate film; and
   forming a lower film pattern by transferring the intermediate film pattern to the lower film.

According to the present invention, there is also provided a method of forming a pattern comprising the steps of;
   forming a lower film on a substrate, the lower film being a film containing carbon atom at a ratio of 80 wt % or more, or a vapor phase deposition film;
   forming an adhesion-promoting film on a surface of the lower film;

forming a resist film on a surface of the adhesion-promoting film;

forming a resist pattern by conducting a patterning exposure of the resist film; and forming a lower film pattern by transferring the resist pattern to the lower film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1G' illustrates problems accompanied with the conventional method of forming a pattern;

DETAILED DESCRIPTION OF THE INVENTION

It has been found, as a result of intensive study made by the present inventor on the problem of the rupturing of an etching mask formed on a lower film on the occasion of processing the lower film, that the rupturing of an etching mask during etching the lower film is caused due to poor adhesion between the etching mask and the lower film. Namely, even if gas is allowed to stay between the lower film and etching mask, if the adhesion between the etching mask and the lower film is sufficiently strong, the voiding or rupturing of the etching mask would not be caused to occur.

Thus, the method of forming a pattern according to the present invention is featured in that an adhesion-promoting treatment is applied to the surface of the lower film, or that an adhesion-promoting film is formed on the lower film.

With regard to the adhesion-promoting treatment to be employed in the present invention, various treatments such as a treatment to increase the polarity of the surface of the lower film, a treatment to decrease the polarity of the surface of the lower film, a treatment to roughen the surface of the lower film, or a treatment to cause the surface of the lower film to become tacky can be employed.

As for the treatment to increase the polarity of the surface of the lower film, it is preferable to employ a treatment to increase the polarity to such an extent that the contact angle of the surface of the lower film to pure water becomes not more than 20°. More specifically, a treatment to irradiate an energy beam to the lower film, or a treatment to expose the lower film to ozone can be employed for the purpose of increasing the polarity of the surface of the lower film.

According to the method of the present invention which is constructed as described above, an adhesion-promoting treatment is applied to the surface of the lower film, or an adhesion-promoting film is formed on the lower film. As a result, the content of carbon atom in the lower film is increased, and hence the gas permeability thereof is lowered, so that even if a source gas or part thereof is allowed to stay between the lower film and the overlying etching mask on the occasion of etching the lower film, it is possible, due to a strong adhesion between the lower film and the etching mask, to prevent the etching mask from being voided or ruptured. Therefore, it is now possible to properly perform the processing of the lower film.

Next, various embodiments of the present invention will be explained in detail with reference to the drawings.

Figure 1A:
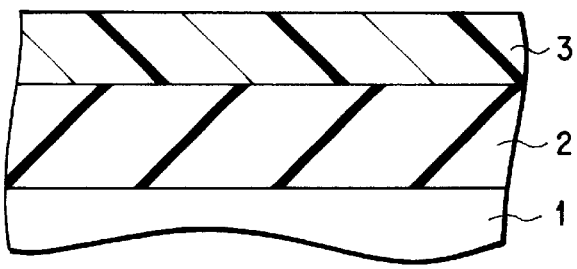
FIGS. 1A to 1H are the cross-sectional views sequentially illustrating the process of forming a pattern according to one example of the present invention.

First of all, as shown in FIG. 1A, a lower film 3 is formed on a wafer substrate 1 (e.g. a silicon substrate). By the way, although the lower film 3 is formed on a wafer substrate 1 with a processing film 2 being interposed therebetween in FIG. 1A, this processing film 2 may be omitted.

As for the material for the processing film 2, it is possible to employ a silicon-based insulating film such as silicon oxide film, a silicon nitride film, a silicon oxynitride film, and a blank material to be employed on the occasion of manufacturing a spin-on-glass; a silicon-based material such as amorphous silicon and polysilicon; and a wiring material such as aluminum, aluminum silicide, copper and tungsten.

The thickness of the lower film 3 should preferably be confined within the range of 20 to 5000 nm. Because if the film thickness of the lower film 3 is less than 20 nm, the lower film 3 would be erased away during etching the processing film 2, thereby making it difficult to processing the processing film 2 into a film of desired dimension. On the other hand, if the film thickness of the lower film 3 is larger than 5000 nm, the dimensional change would become prominent on the occasion of transferring the resist pattern to the lower film 3 by means of a dry etching method.

The lower film 3 is formed of a film containing carbon atom at a ratio of 80 wt % or more, or a vapor phase deposition film. As for the vapor phase deposition film, it is possible to employ a film formed by a vapor deposition method such as a sputtering, a chemical vapor deposition (CVD) method, and evaporation. Such a film includes a silicon oxide film, silicon nitride film, a silicon oxynitride film, an aluminum film, an aluminum silicide film, a titanium nitride film, a tungsten film, and a silicon film.

Next, a film containing carbon atom at a ratio of 80 wt % or more will be explained.

As for the method of forming a film containing carbon atom at a ratio of 80 wt % or more, it is preferable to employ a coating method. Because, the coating method is simple in process as compared with the CVD method, thereby making it possible to reduce the processing cost. Followings are detailed description on the method of forming the film.

First of all, a compound containing carbon atom is dissolved in an organic solvent to prepare a solution for the lower film. The non-limited examples of a compound containing carbon atom include polyarylene, polyarylene ether, phenolic resin, novolac series resin, aromatic polycyclic resin, etc.

As for the molecular weight of such compounds, although there is not any particular limitation, it is preferable to confine it to the range of 200 to 100,000. Because, if this molecular weight is less than 200, the lower film may be dissolved by a solvent to be employed for the resist. On the other hand, if this molecular weight exceeds over 100,000, it may become difficult to dissolve the compounds in an organic solvent, thereby making it difficult to manufacture a solution of raw material.

The compound to be employed in this case is not limited to one kind of material, but may be a mixture containing several kinds of raw material. Further, if desired, it is possible to employ various kinds of additive, such as a thermal polymerization inhibitor which is useful for improving the storage stability; an adhesion improver for improving the adhesion of the film to the processing film; an ultraviolet absorbing dye for preventing the light reflected by the processing film from reflecting into a resist film; an ultraviolet-absorbing polymer such as polysulfone, polybenzimdazole, etc.; a conductive material; a substance which is capable of exhibiting conductivity by the effect from light or heat; or a crosslinking agent which is capable of crosslinking a metal compound.

As for the organic solvents which are useful in this case, although there is not any particular limitation, it is possible to employ a ketone-based solvent such as acetone, methylethyl ketone, methylisobutyl ketone, cyclohexanone, etc.; a cellosolve-based solvent such as methyl cellosolve, methyl cellosolve acetate, ethyl cellosolve acetate, etc.; an ester-based solvent such as ethyl lactate, ethyl acetate, butyl acetate, isoamyl acetate; an alcohol-based solvent such as methanol, ethanol, isopropanol, etc.; anisole; toluene; xylene; naphtha, etc.

After a coat material is prepared by a method as mentioned above, the coat material is coated on the surface of the processing film 2 by way of a spin coating method to form a coated layer, which is then heated to evaporate a solvent included therein to thereby form the lower film 3.

The ratio or content of carbon atom in the lower film 3 after this heating step should be 80 parts by weight or more per 100 parts by weight of the lower film 3. Because, if the ratio of carbon atom in the lower film 3 is less than 80 parts by weight, it becomes impossible to secure a sufficient etching resistance which is required in carrying out the etching of the processing film 2.

Then, for the purpose of preventing the voiding or rupturing of the etching mask to be employed in the processing of the lower film 3, a treatment to promote the adhesion between the lower film 3 and the overlying film is performed. As for the adhesion-promoting treatment, it is preferable to employ a treatment of increasing the polarity of the lower film 3 if the polarity of the intermediate film is high, or to employ a treatment of decreasing the polarity of the lower film 3 if the polarity of the intermediate film is low.

The treatment to increase the polarity of the surface of the lower film 3 should preferably be performed in such a manner that the contact angle of the surface of the lower film 3 to pure water becomes not more than 20°, more preferably not more than 10°. The treatment to decrease the polarity of the surface of the lower film 3 should preferably be performed in such a manner that the contact angle of the surface of the lower film 3 to pure water becomes not less than 50°, more preferably not less than 70°.

Although it is preferable to incorporate a substituent group containing oxygen atom such as carbonyl group into a compound constituting the lower film 3 for the purpose of increasing the polarity of the lower film 3, the etching resistance of the lower film 3 may be deteriorated by the oxygen atom. If the contact angle of the surface of the lower film 3 to pure water is higher than 20°, a surface region 4 of the lower film 3 may be oxidized by irradiating an energy beam onto the lower film 3 or by exposing the lower film 3 to an atmosphere containing ozone, thereby increasing the polarity of the lower film 3.

As for the energy beam, although there is not any particular limitation, it is preferable to employ a light having a wavelength region of not more than 700 nm in wavelength, or to employ X-rays. Because, if the wavelength of the energy beam is larger than 700 nm, the energy to be obtained would become too weak to sufficiently oxidize the surface of the lower film 3. The exposure dosage in this case should preferably be confined to the range of 1 mJ/cm$^2$ to 1000 J/cm$^2$. Because, if the exposure dosage is less than 1 mJ/cm$^2$, the energy available would be too weak to sufficiently oxidize the surface of the lower film 3. On the other hand, if the exposure dosage is more than 1000 J/cm$^2$, the energy available would become excessive, thereby inviting the deterioration of throughput.

The treatment to decrease the polarity of the surface of the lower film 3 can be performed by exposing the surface of the lower film 3 to an atmosphere containing a vapor of a predetermined compound such as hexamethyl disilane, etc.

In addition to the aforementioned adhesion promoting treatments by way of increasing or decreasing the polarity of the lower film 3, it is also possible to employ a treatment of making tacky the surface of the lower film 3, or a treatment of roughening the surface of the lower film 3.

It is also possible to form an adhesion-promoting film which is capable of improving the adhesion of the lower film 3 to an overlying film such as an intermediate film to be described hereinafter. As for the materials for forming such an adhesion-promoting film, it is preferable to employ a material having a high polarity such as polyarylene, polyarylene ether, phenolic resin, novolac series resin, acrylic resin, etc. The film thickness of the adhesion-promoting film should preferably be confined within the range of about 10 to 1000 nm.

Figure 1B:
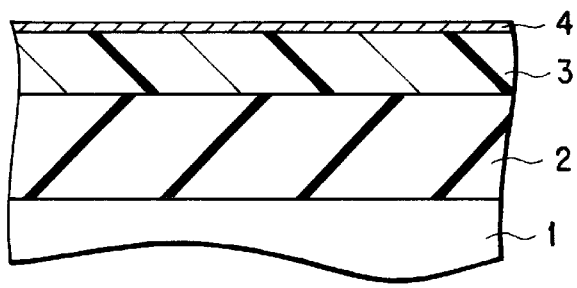
Figure 1C:
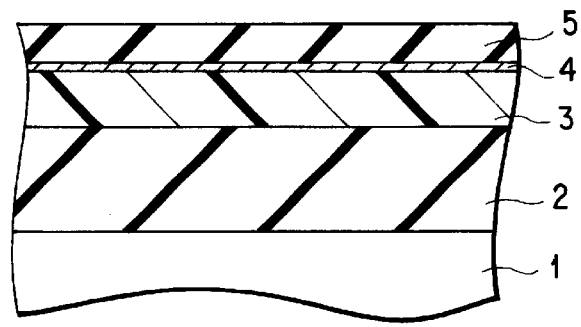

Next, as shown in FIG. 1C, an intermediate film 5 is formed on the surface of the lower film 3. The film thickness of the intermediate film 5 should preferably be confined within the range of 10 to 1000 nm. Because, if the film thickness of the intermediate film 5 is less than 10 nm, the intermediate film 5 may be erased away during etching step of the lower film 3. On the other hand, if the film thickness of the intermediate film 5 is more than 1000 nm, it becomes difficult to easily work the intermediate film 5.

Although there is not any particular limitation as for the materials for the intermediate film 5 as long as the material contains a component which has an etching resistance in the etching step of the lower film 3, it is preferable to employ an inorganic oxide such as silicon oxide, aluminum oxide, titanium oxide or tungsten oxide.

Due to the polarity which is provided by the bonding between oxygen atom and an inorganic element in these materials, the wettability of these materials to the surface region 4 of lower film exhibiting a high polarity can be improved and hence the adhesion of these materials to the surface region 4 can be enhanced, thereby making it possible to prevent the rupturing of the etching mask.

By the way, where the intermediate film 5 has a low polarity, it is also possible to employ a material exhibiting a low polarity such as polymethyl siloxane, and fluorine containing resin.

Figure 1D:
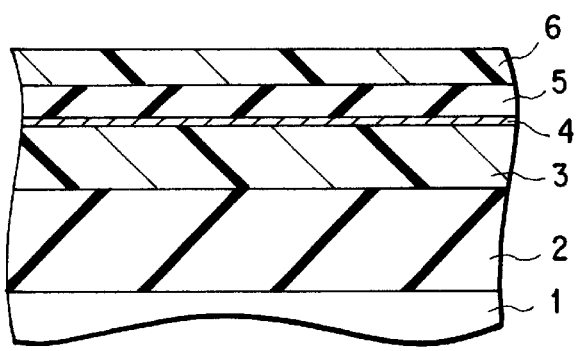

Thereafter, as shown in FIG. 1D, a solution of resist is coated on the surface of the intermediate film 5, and then, the resultant layer is heated to form a resist film 6. The thinner the film thickness of the resist film 6 is, the more it becomes feasible to improve the exposure tolerance, focus tolerance or resolution on the occasion of light exposure. Therefore, as long as it is possible to perform the etching of the lower film 3 with excellent dimension controllability, the film thickness of the resist film 6 should be as thin as possible. It is generally preferable to confine the film thickness of the resist film 6 to the range of 10 to 10000 nm.

There is not any particular limitation on the kind of resist, i.e. either a positive resist or a negative resist can be suitably selected depending on the end-use. Specific examples of the positive resist are a resist comprising naphthoquinone diazide and novolak resin (IX-770, JSR Co.); and a chemical amplification type resist comprising polyvinylphenol resin protected by t-BOC and a photo acid generator (APEX-E, Shipley Co.). Examples of the negative resist are, for instance, a chemical amplification type resist comprising polyvinylphenol, melamine resin and a photo-acid generator (SNR248, Shiplay Co.), and a resist comprising polyvinylphenol and a bisazide compound (RD-2000D, Hitachi Kasei Co.), and a chemically amplified resist containing polymethyl methacrylate protected with aliphatic hydrocarbon and a photo acid generator.

Any one of these resist solutions is then coated on the lower film 3 by means of a spin coating method or a dipping method for instance, and then the solvent in the resist solution is allowed to evaporate by heating it thereby to form the resist film 6, which is then subjected to a light exposure step.

As for the light source for this light exposure, there is not any particular limitation, i.e. ultraviolet rays, X-rays, electron beam, ion beam, etc. can be employed. As for the ultraviolet rays, it is possible to employ the g-ray (436 nm) or i-ray (365 nm) of mercury lamp; or an excimer laser beam such as XeF (wavelength=351 nm), XeCl (wavelength=308 nm), KrF (wavelength=248 nm), KrCl (wavelength=222 nm), ArF (wavelength=193 nm) and F2 (wavelength=151 nm).

Figure 1E:
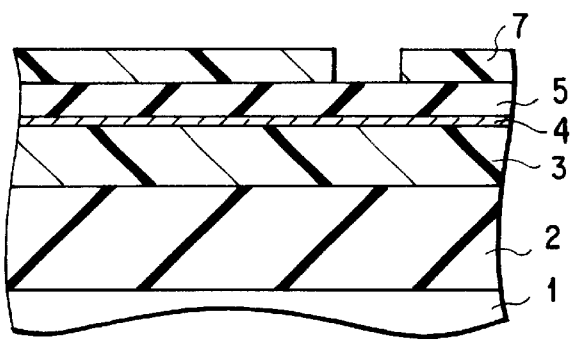

Then, as shown in FIG. 1E, the development treatment of the resist film 6 is performed using an alkaline developing solution such as TMAH or choline to form a resist pattern 7. Further, if required, an upper reflection preventive film may be formed on the surface of the resist film for the purpose of minimizing the multiple reflection in the resist film that may be generated in the step of light exposure, or an upper electrification preventive film may be formed on the surface of the resist film for the purpose of preventing the generation of charge-up that may be caused to occur in the step of electron beam exposure.

Figure 1F:
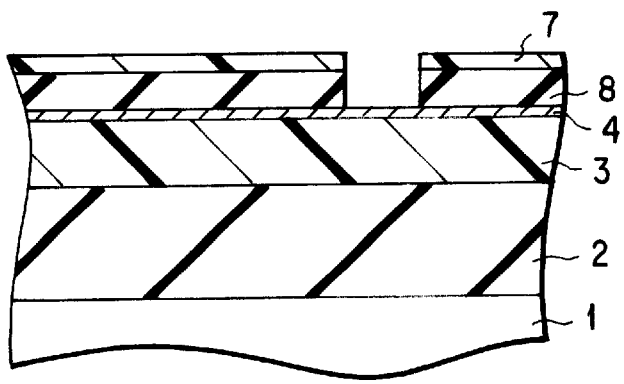

Thereafter, as shown in FIG. 1F, the configuration of the resist pattern 7 is transferred to the intermediate film 5 by means of dry etching method to thereby obtain an intermediate film pattern 8. As for the etching method which is useful in this case, a reactive ion etching, a magnetron type reactive ion etching, an electron beam ion etching, an ICP etching or ECR ion etching may be employed. Namely, there is not any particular limitation on this etching method as long as it is possible to perform a fine etching work.

Figure 1G:
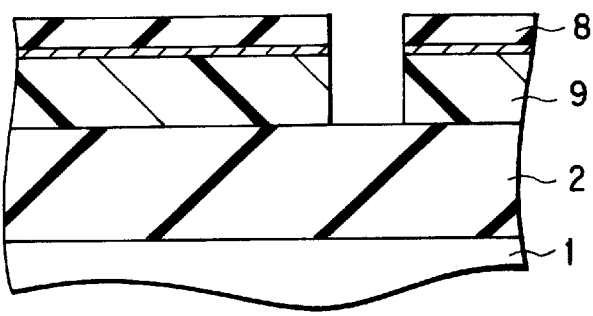

Then, as shown in FIG. 1G, the configuration of the intermediate film pattern 8 is transferred to the lower film 3 by means of dry etching method to thereby obtain a lower film pattern 9. As for the etching method which is useful in this case, a reactive ion etching, a magnetron type reactive ion etching, an electron beam ion etching, an ICP etching or ECR ion etching may be employed. Namely, there is not any particular limitation on this etching method as long as it is possible to perform a fine etching work. As for the source gas in this case, it is preferable to employ a gas containing oxygen atom or chlorine atom or nitrogen because of the fact that a high reactivity can be realized between the lower film and oxygen radical or chlorine radical or nitrogen, thereby making it possible to work the processing film with an excellent throughput.

As for the gas containing oxygen atom or chlorine atom or nitrogen, various kinds of gas such as $O_2$, $CO$, $CO_2$, $Cl_2$, $N_2$, $NH_3$, or a mixture thereof can be employed. It is further preferable that the source gas contains therein sulfur atom because of the reason that the lower film would be enabled to be anisotropically worked in an excellent manner. Examples of such a source gas are $SO_2$. These source gases may further contain other kinds of gas such as Ar and He.

When etching of the lower film 3 is performed as described above, the lower film 3 can be properly worked without inviting the rupturing of the intermediate pattern 8. The reason for this can be explained as follows.

Namely, when the lower film 3 is etched according to a conventional method, volatile substances generated from the reaction between the radicals generated from the source gas and the lower film, the source gas, or the radicals generated from the source gas are caused to stay on the surface of the lower film, so that in the course of etching, the rupturing of the intermediate pattern 8 is caused to occur due to the presence of these substances including the volatile substances stayed on the surface of the lower film.

Whereas, according to the method of the present invention, since the adhesion between the intermediate pattern 8 and the lower film 3 is improved by increasing the polarity of the surface of the lower film, the intermediate pattern 8 is assumably enabled to become hardly rupturable even if the volatile substances, the source gas or the radicals generated from the source gas are caused to stay on the surface of the lower film.

Figure 1H:
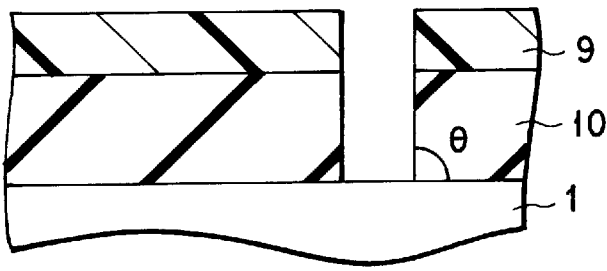
Figure 1G:
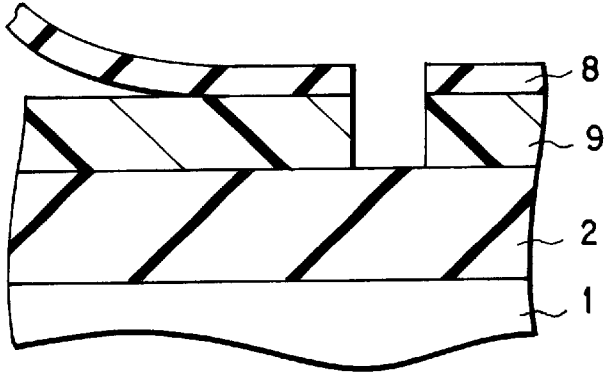

Next, as shown in FIG. 1H, the configuration of the lower film pattern 9 is transferred to the processing film 2 by means of dry etching method to thereby obtain a processing film pattern 10. As for the etching method in this case, the same method as employed in the patterning of the intermediate film can be employed. It is possible in this manner to perform the patterning of the processing film with high anisotropy.

In the above embodiment, the configuration of the resist pattern is successively transferred to the intermediate layer and then to the lower film. However, the resist pattern may be formed directly on the surface of the lower film, and then, the processing of the lower film can be performed. In this case, since the resist pattern is employed as an etching mask for the lower film, the resist is required to contain a metal atom or a semiconductor atom. As for the metal atom, it is possible to employ aluminum, titanium, zirconium, tungsten, etc. As for the semiconductor atom, it is possible to employ silicon, germanium, etc.

Since the polarity is provided by the bonding between oxygen atom and a metal atom or a semiconductor atom in the resist containing a metal atom or a semiconductor atom, the wettability of the resist to the surface of lower film can be improved due to increase in polarity of the lower film in the same manner as in the case of the intermediate film, and hence the adhesion between the lower film and the resist pattern can be enhanced. As a result, it is possible to prevent the rupturing of the etching mask formed of the resist pattern.

As explained above, even in the case where the processing of the lower film is performed after forming a resist pattern directly on the surface of the lower film, it is still possible, for the purpose of improving the adhesion between the resist pattern and the lower film, to form an adhesion-promoting film on the surface of the lower film in the same manner as in the case of the intermediate film. In this case, the resist is not required to contain a metal atom or a semiconductor atom.

The present invention will be further explained in detail with reference to the following various Examples.

EXAMPLE 1

In this example, an embodiment where an $SiO_2$ film was used as a processing film (a film to be worked) and worked by successively using the intermediate film and the lower film as a mask will be explained with reference to FIGS. 1A to 1H.

First of all, an $SiO_2$ film 2 having a thickness of 500 nm was deposited as a processing film on the surface of a silicon wafer 1 by means of LPCVD method. Then, a lower film 3 was formed on the surface of the processing film 2 by the following methods (R1) to (R5) and (S1) to (S10) (FIG. 1A).

By the way, if required, the lower film 3 may be irradiated with an energy beam as shown in FIG. 1B or exposed to ozone in advance so as to increase the polarity of the lower film 3.

(R1): 10 g of a carbon-containing compound represented by the following formula (1) and having a molecular weight of 8,000 was dissolved in 90 g of ethyl lactate to prepare a solution for the lower film, which was then spin-coated on the surface of the processing film 2. Then, the coated layer was baked for 120 seconds at a temperature of 350° C. by making use of a hot plate under a nitrogen atmosphere containing oxygen at a concentration of 50 ppm or less, thereby forming a lower film. By the way, every lower films formed in this manner had a film thickness of 300 nm.

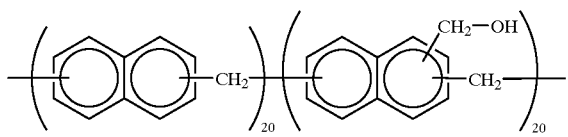

(1)

(R2): The concentration of oxygen in (R1) was set to 1%.

(R3): The concentration of oxygen in (R1) was set to 20%.

(R4): A DC sputtering was performed in an argon atmosphere using a graphite plate as a target to thereby form a carbon film which was employed as a lower film.

(R5): 10 g of cresol novolac having a weight average molecular weight of 12,000 was dissolved in 90 g of ethyl lactate to prepare a solution for the lower film, which was then spin-coated and baked for 120 seconds at a temperature of 350° C., thereby forming a lower film.

(S1): The lower film formed by the method of (R1) was dipped into an aqueous solution of ozone containing ozone at a concentration of 15 ppm for one second to thereby increase the polarity of the surface of the carbon film.

(S2): The dipping time in (S1) was set to 10 seconds.

(S3): The dipping time in (S1) was set to 60 seconds.

(S4): The lower film formed by the method of (S1) was irradiated by an excimer lamp with a light of 157 nm in wavelength at a dosage of 100 mJ/cm$^2$ to thereby increase the polarity of the surface of the carbon film.

(S5): The lower film formed by the method of (S1) was irradiated with an electron beam at a dosage of 1 C/cm$^2$ to thereby increase the polarity of the surface of the carbon film.

(S6): The carbon film formed by the method of (R4) was dipped into an aqueous solution of ozone containing ozone at a concentration of 15 ppm for 10 seconds to thereby increase the polarity of the surface of the carbon film.

(S7): The carbon film formed by the method of (R4) was dipped into an aqueous solution of ozone containing ozone at a concentration of 15 ppm for 60 seconds to thereby increase the polarity of the surface of the carbon film.

(S8): The carbon film formed by the method of (R4) was irradiated by an excimer lamp with a light of 157 nm in wavelength at a dosage of 100 mJ/cm$^2$ to thereby increase the polarity of the surface of the carbon film.

(S9): The dosage of the light in (S8) was set to 1 J/cm$^2$.

(S10): In (R1), 0.1 g of a surfactant represented by the following formula (2) was added to the solution of the lower film on the occasion of preparing the solution of the lower film to thereby increase the polarity of the surface of the lower film.

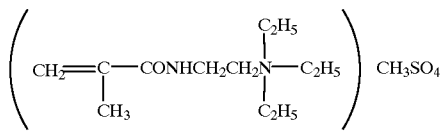

(2)

(S11): 9 g of polyvinyl phenol having a weight average molecular weight of 12,000 was dissolved in 91 g of ethyl lactate to prepare a solution, which was then spin-coated on the surface of the lower film formed by the method of (R1). Then, the coated layer was baked for 120 seconds at a temperature of 300° C. by making use of a hot plate in air atmosphere, thereby forming an adhesion-promoting film having a thickness of 50 nm.

(S12): An adhesion-promoting film was formed, using the method of (S11), on the lower film which was formed by the method of (R2).

(S13): An adhesion-promoting film was formed, using the method of (S11), on the lower film which was formed by the method of (R3).

(S14): An adhesion-promoting film was formed, using the method of (S11), on the lower film which was formed by the method of (R4).

(S15): The lower film formed by the method of (R5) was dipped into an aqueous solution of ozone containing ozone at a concentration of 15 ppm for ten seconds to thereby increase the polarity of the surface of the carbon film.

The carbon content of the lower films prepared according to the above methods was analyzed by means of elemental analysis, the results being illustrated in the following Table 1. The results obtained by measuring the contact angle of the lower films to pure water are also shown in the following Table 1.

Then, 8 g of polysiloxane represented by the following formula (3) and having a molecular weight of 7,000 was dissolved in 92 g of isopropyl alcohol to prepare a solution for the intermediate film, which was then spin-coated on the surface of the lower film 3. Then, the coated layer was baked for 120 seconds at a temperature of 300° C. by making use of a hot plate, thereby forming an intermediate film 5 having a thickness of 70 nm as shown in FIG. 1C.

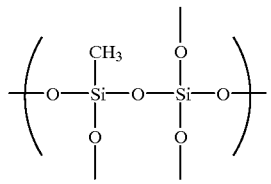

(3)

Then, 9.9 g of a protected resin represented by the following formula (4) and having a molecular weight of 12,000 and 0.1 g of an acid-generating agent represented by the following formula (5) were dissolved in 90 g of ethyl lactate to thereby form a resist solution, which was then coated on the surface of the intermediate film 5 by means of spin-coating method to form a coated layer. Thereafter, the coated layer was baked for 90 seconds at a temperature of 140° C. by making use of a hot plate to form the resist film 6 having a thickness of 150 nm as shown in FIG. 1D.

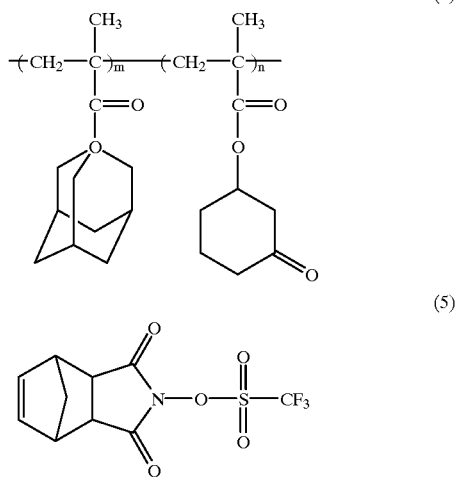

(4)

(5)

The resist film 6 was then subjected to a patterning exposure by making use of a reduced optical type stepper (NA=0.6) using ArF excimer laser as a light source. Further, the resist film 6 was baked for 90 seconds at a temperature of 140° C. by making use of a hot plate.

Thereafter, the resist-film 6 was subjected to a paddle development for 30 seconds by making use of a 0.21N tetraammonium hydroxide to form a contact hole pattern 7 having a diameter of 0.15 μm as shown in FIG. 1E.

Then, as shown in FIG. 1F, the resist pattern 7 was transferred to the intermediate film 3 to form an intermediate film pattern 8. In this case, the etching was performed under the conditions wherein a magnetron type etching apparatus was employed as an etching apparatus, a mixed gas consisting of $CF_4/O_2/Ar$ (flow rates thereof: 20/20/100 sccm, respectively) was employed as a source gas, the excitation power density was set to 2 W/cm$^2$, the degree of vacuum was set to 75 mTorr, and the temperature of the substrate was set to 80° C. The etching time was set to such that the etching became excessive by 50% over the just time which was calculated based on the etching rate inside the pattern.

Thereafter, as shown in FIG. 1G, the intermediate film pattern 8 was transferred to the lower film 3 to form a lower film pattern 9. In this case, the etching was performed under the conditions wherein a magnetron type reactive-ion etching apparatus was employed as an etching apparatus, a mixed gas consisting of $O_2/N_2$ (flow rates thereof: 100/10 sccm, respectively) was employed as a source gas, the excitation power density was set to 2 W/cm$^2$, the degree of vacuum was set to 40 mTorr, and the temperature of the substrate was set to 20° C.

As a result, as shown in FIG. 1G', as far as the intermediate films which were formed on the lower films (R1-R4, S10) each exhibiting a higher contact angle (exceeding over 20°) were concerned, a large number of voids could be recognized inside the intermediate film, and at the same time, the rupturing of the intermediate film was also recognized.

Figure 3:
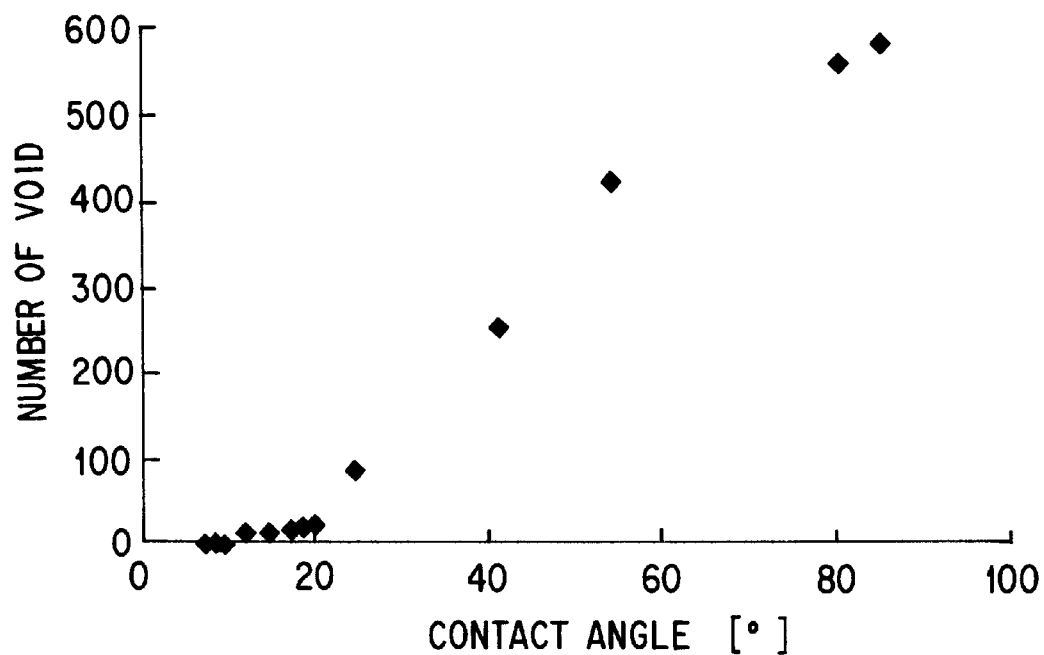
FIG. 3 is a graph showing the relationship between the polarity of the surface of the lower film and the number of void generated thereon.

The following Table 1 also shows the results of investigations with regard to the contact angle of the lower film and to the number of voids generated inside the intermediate film. Further, the results obtained by plotting the number of voids relative to the contact angle are shown in FIG. 3. It will be seen from these Table 1 and FIG. 3 that the smaller the contact angle is, the smaller the number of the void would become, so that the effect of reducing the number of void can become recognized when the contact angle becomes smaller than about 20°, and the generation of void can be completely prevented when the contact angle becomes 10° or less.

By the way, it will be recognized from the comparison between (R1), and (S1) to (S5), (S10), (S11); between (R4) and (S6) to (S9), (S14); between (R2) and (S12); between (R3) and (S13); and between (R5) and (S15) in the following Table 1 that the contact angle of the processing film to pure water is increased due to the dipping of the lower film, the irradiation of electron beam, the irradiation of the excimer lamp, the coating of the surfactant and the formation of the adhesion-promoting film. By the way, the contact angle of the intermediate film to pure water was 80 and hence the intermediate film was high in hydrophilicity. In view of these facts, the reason for this reduction of void can be attributed to the facts that the hydrophilicity of the surface of the lower film was enhanced, thus making it possible to improve the adhesion between the lower film and the intermediate film exhibiting a high hydrophilicity.

Then, as shown in FIG. 1H, the lower film pattern 9 was transferred to the processing film 2. The etching apparatus and etching conditions employed in this step were the same as those adopted on the occasion of etching the intermediate film 5 with the resist pattern 6 being employed as an etching mask.

Figure 4:
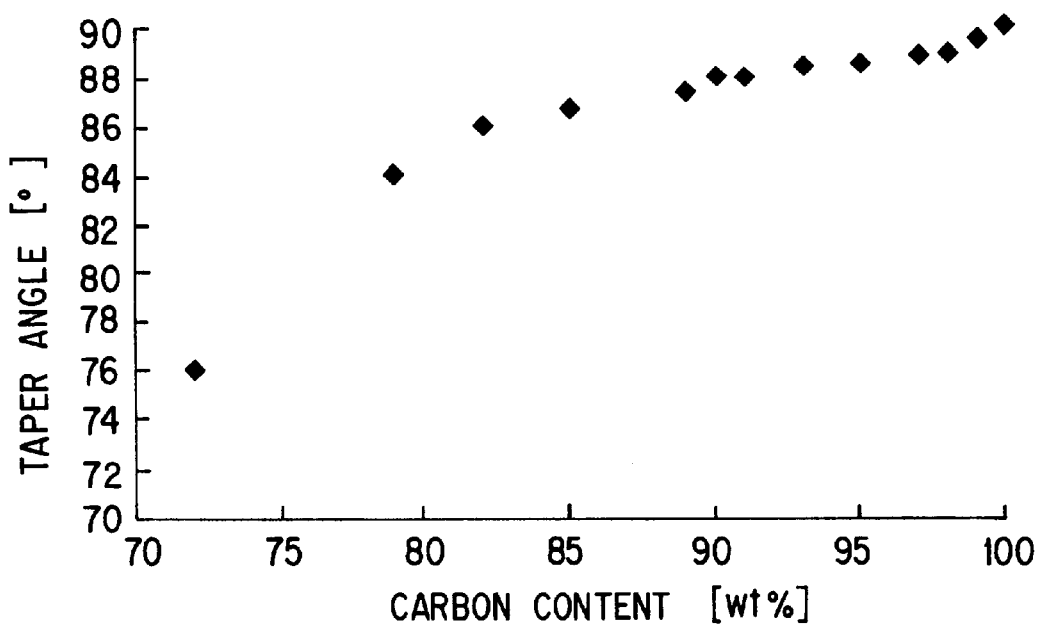
FIG. 4 shows a graph showing the relationship between the content of carbon atom in the lower film and the taper angle of the film that has been worked.

The following Table 1 also shows the results obtained through the measurement of the taper angle of the processing film relative to the lower film. Further, the results obtained by plotting the taper angle relative to the carbon content are shown in FIG. 4. It will be seen from these Table 1 and FIG. 4 that the higher the carbon content of the lower film is, the higher the anisotropy with which the processing film can be worked, so that when the carbon content becomes larger than about 80% by weight, it becomes possible to realize a high anisotropy where the taper angle θ is 85° (tolerance value) or more.

The fact that the higher the carbon content of the lower film is, the higher the anisotropy with which the processing film can be worked may be attributed to the fact that carbon atom can be hardly sputtered during the etching step of the processing film, so that the higher the carbon content of the lower film is, the more it becomes difficult to retrogress the lower film pattern during the etching of the processing film.

TABLE 1

| Method of Forming Lower Film | Carbon Content (Wt %) | Contact Angle [°] | Number Of void | Taper Angle [°] |
| --- | --- | --- | --- | --- |
| (R1) | 92 | 80 | 560 | 88.5 |
| (R2) | 82 | 54 | 420 | 86 |
| (R3) | 79 | 41 | 250 | 84 |
| (R4) | 100 | 85 | 580 | 90 |
| (R5) | 72 | 19 | 14 | 76 |
| (S1) | 91 | 20 | 16 | 88 |
| (S2) | 90 | 12 | 9 | 88 |
| (S3) | 89 | 8 | 0 | 87.5 |
| (S4) | 91 | 18 | 12 | 88 |
| (S5) | 90 | 9 | 0 | 88 |
| (S6) | 98 | 17 | 11 | 89 |
| (S7) | 97 | 9 | 0 | 89 |
| (S8) | 99 | 15 | 9 | 89.5 |
| (S9) | 95 | 7 | 0 | 88.5 |
| (S10) | 85 | 25 | 85 | 86.5 |
| (S11) | 92 | 19 | 14 | 88.5 |
| (S12) | 82 | 19 | 14 | 86 |
| (S13) | 79 | 19 | 14 | 84 |
| (S14) | 100 | 19 | 14 | 90 |
| (S15) | 71 | 10 | 0 | 74 |

EXAMPLE 2

This example will be explained with reference to FIGS. 2A to 2F wherein almost the same procedures of Example 1 were repeated except that a resist containing silicon was employed as an etching mask for processing the lower film.

Figure 2A:
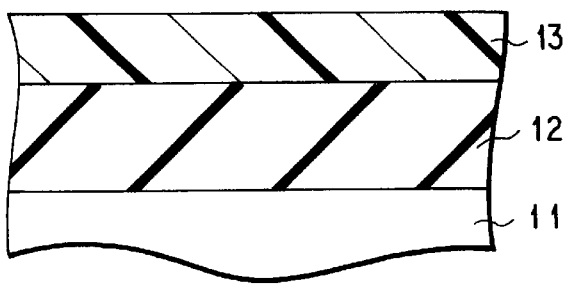
FIGS. 2A to 2F are the cross-sectional views sequentially illustrating the process of forming a pattern according to another example of the present invention.
Figure 2B:
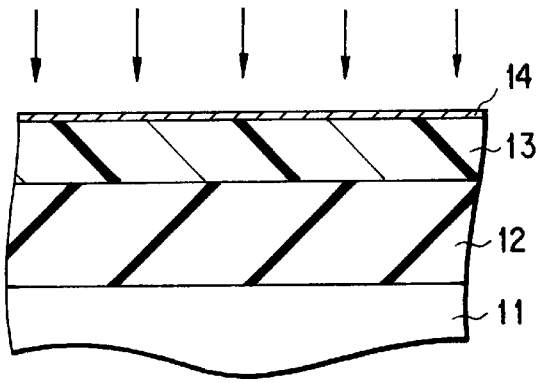

First of all, as shown in FIGS. 2A and 2B, a processing film 12 and a lower film 13 were successively deposited on the surface of a silicon wafer 11 in the same manner as in Example 1. By the way, the polarity-enhancing treatment of the lower film 13 was effected through the deposition of a high polarity region 14 on the surface of the lower film 13.

Figure 2C:
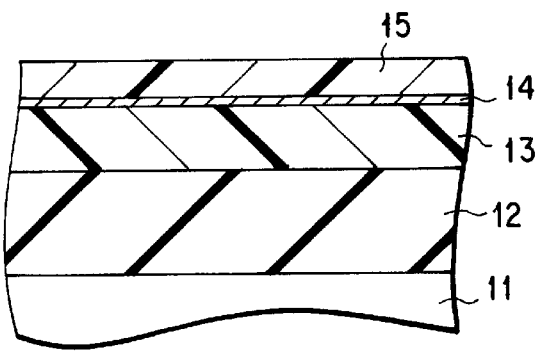

Then, 9.9 g of a protected resin represented by the following formula (6) and having a molecular weight of 13,000 and 0.1 g of an acid-generating agent represented by the following formula (7) were dissolved in 90 g of ethyl lactate to thereby form a resist solution, which was then coated on the surface of the lower film 13 by means of spin-coating method to form a coated layer. Thereafter, the coated layer was baked for 90 seconds at a temperature of 120° C. by making use of a hot plate to form the resist film 15 having a thickness of 150 nm as shown in FIG. 2C.

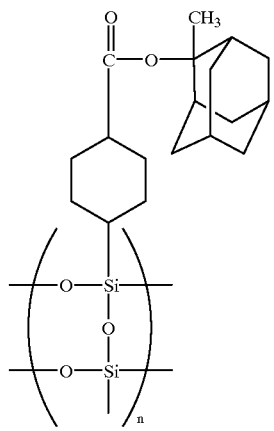

(6)

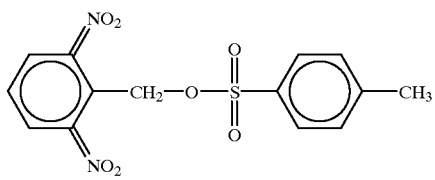

(7)

The resist film 15 was then subjected to a patterning exposure by making use of a reduced optical type stepper (NA=0.6) using ArF excimer laser as a light source. Further, the resist film 15 was baked for 90 seconds at a temperature of 120° C. by making use of a hot plate.

Figure 2D:
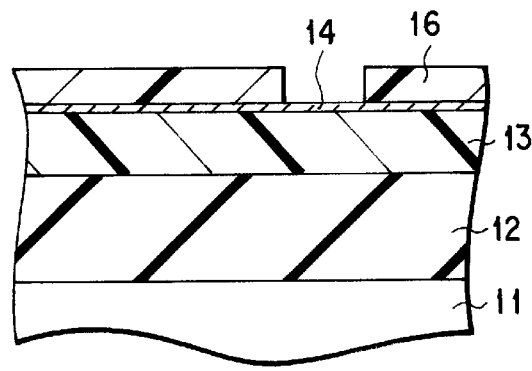

Thereafter, the resist film 15 was subjected to a paddle development for 30 seconds by making use of a 0.21N tetraammonium hydroxide to form a resist pattern 16 having a contact hole pattern having a diameter of 0.15 μm as shown in FIG. 2D.

Figure 2E:
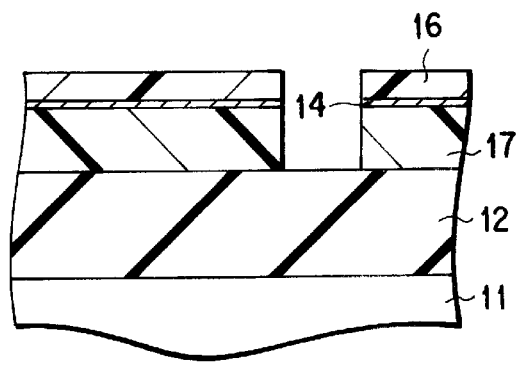

Then, as shown in FIG. 2E, the resist pattern 16 was transferred to the lower film 13 to form a lower film pattern 17. In this case, the etching apparatus and the etching conditions employed therein were the same as those employed on the occasion of transferring the intermediate pattern to the lower film in Example 1.

The following Table 2 shows the results of investigations with regard to the contact angle of the lower film and to the number of voids generated in the resist pattern.

It will be seen from the Table 2 that the smaller the contact angle is, the smaller the number of the void would become, so that the effect of reducing the number of void can become recognized when the contact angle becomes smaller than about 20°, and the generation of void can be completely prevented when the contact angle becomes 10° or less.

By the way, the contact angle of the resist film to pure water was 9° and hence the resist film was high in hydrophilicity. In view of these facts, the reason for this reduction of void can be attributed to the facts that the hydrophilicity of the surface of the lower film was enhanced, thus making it possible to improve the adhesion between the lower film and the resist film exhibiting a high hydrophilicity.

Figure 2F:
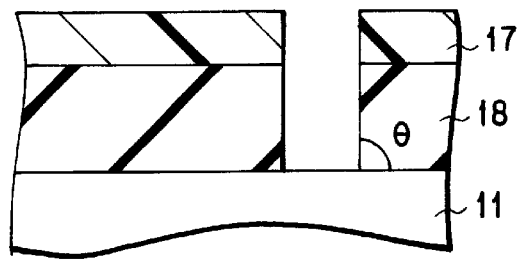

Then, as shown in FIG. 2F, the lower film pattern 17 thus formed was transferred to the processing film 12 to obtain a processing film pattern 18. The etching apparatus and etching conditions employed in this step were the same as those employed on the occasion of transferring the resist pattern to the intermediate film in Example 1.

The following Table 2 also shows the results obtained through the measurement of the taper angle of the processing film relative to the lower film. It will be seen from Table 2 that when the carbon content becomes larger than about 80% by weight, it becomes possible to realize a high anisotropy where the taper angle θ is 85° (tolerance value) or more.

The fact that the higher the carbon content of the lower film is, the higher the anisotropy with which the processing film can be worked may be attributed to the fact that carbon atom can be hardly sputtered during the etching step of the processing film, so that the higher the carbon content of the lower film is, the more it becomes difficult to retrogress the lower film pattern during the etching of the processing film.

TABLE 2

| Method of Forming Lower Film | Contact Angle (°) | Number of Void | Taper Angle (°) |
|---|---|---|---|
| (R1) | 81 | 570 | 88.5 |
| (R2) | 54 | 410 | 87 |
| (R3) | 42 | 260 | 84 |
| (R4) | 84 | 580 | 90 |
| (R5) | 20 | 16 | 76 |
| (S1) | 21 | 18 | 88 |
| (S2) | 13 | 11 | 88 |
| (S3) | 9 | 0 | 87.5 |
| (S4) | 19 | 14 | 88 |
| (S5) | 10 | 0 | 88 |
| (S6) | 18 | 13 | 89 |
| (S7) | 10 | 0 | 89 |
| (S8) | 14 | 10 | 89.5 |
| (S9) | 8 | 0 | 88.5 |
| (S10) | 26 | 86 | 86.5 |
| (S11) | 20 | 16 | 88.5 |
| (S12) | 20 | 15 | 86 |
| (S13) | 20 | 17 | 84 |
| (S14) | 20 | 16 | 90 |
| (S15) | 11 | 0 | 74 |

EXAMPLE 3

In this example, an embodiment where a silicon nitride film which was formed by means of a CVD method was used as a lower film will be explained.

First of all, as shown in FIG. 1A, a silicon nitride film 3 was deposited as a lower film on the surface of a silicon wafer 1 by the following method.

By the way, if required, the lower film may be irradiated in advance with an energy beam as shown in FIG. 1B or alternatively, an adhesion-promoting film 4 may be formed in advance so as to enhance the adhesion between the lower film 3 and the intermediate film. (R6): A silicon nitride film having a thickness of 200 nm was formed by means of a CVD method.

(S16): The silicon nitride film formed by the method of (R6) was irradiated with an electron beam at a dosage of 1 mC/cm².

(S17): The dosage in (R6) was set to 10 mC/cm².

(S18): The dosage in (R6) was set to 100 MC/cm².

(S19): The dosage in (R6) was set to 1 C/cm².

(S20): An adhesion-promoting film was formed on the lower film by the method of Example 1.

Then, as shown in FIG. 1C, an intermediate film 5 was formed, by making use of the method of (S11) of Example 1, on each of the lower films 3 that had been formed by the methods described above.

Then, as shown in FIG. 1D, a resist film 6 was formed on the intermediate film 5 in the same manner as employed in Example 1, and subjected to a patterning exposure to form a contact hole pattern 7 as shown in FIG. 1E.

Thereafter, in the same method as employed in Example 1, the resist pattern 7 was transferred to the intermediate film 5 as shown in FIG. 1F to thereby form an intermediate film pattern 8.

Thereafter, as shown in FIG. 1G, the intermediate film pattern 8 was transferred to the lower film 3 to form a lower film pattern 9. In this case, the etching was performed under the conditions wherein a magnetron type reactive-ion etching apparatus was employed as an etching apparatus, a mixed gas consisting of $O2/N_2$ (flow rates thereof: 100/10 sccm, respectively) was employed as a source gas, the excitation power density was set to 2 W/cm², the degree of vacuum was set to 40 mTorr, and the temperature of the substrate was set to 20° C.

As a result, as shown in FIG. 1G', as far as the lower film which was not irradiated by an electron beam was concerned, the generation of voids could be recognized inside the intermediate film.

The results of investigations with regard to the contact angle of each of the lower film and the adhesion-promoting film to pure water as well as with regard to the number of voids generated inside the intermediate film are shown in the following Table 3. By the way, the contact angle of the intermediate film to pure water was 8° and hence the intermediate film was high in hydrophilicity.

It will be seen from this Table 3 that the hydrophilicity of the lower film was enhanced by the irradiation of an electron beam to the lower film, or by the deposition of the adhesion-promoting film on the lower film.

In view of these facts, the reason for the reduction of void by the irradiation of an electron beam or by the deposition of the adhesion-promoting film can be attributed, as in the case of Example 1, to the facts that the hydrophilicity of the surface of the lower film was enhanced due to the irradiation of an electron beam to the lower film, or by the deposition of the adhesion-promoting film, thus making it possible to improve the adhesion between the lower film and the intermediate film exhibiting a high hydrophilicity.

TABLE 3

| Method of Forming lower Film | Contact angle [°] | Number of void |
|---|---|---|
| (R6) | 57 | 430 |
| (S16) | 20 | 12 |
| (S17) | 18 | 2 |
| (S18) | 16 | 0 |
| (S19) | 15 | 0 |
| (S20) | 14 | 0 |

EXAMPLE 4

In this example, an embodiment where the polarity of the lower film was lowered for the purpose of enhancing the adhesion between the lower film and the intermediate film will be explained.

First of all, as shown in FIG. 1A, an aluminum silicide film 2 was deposited as a processing film on the surface of a silicon wafer. Thereafter, a lower film 3 was formed by the following method.

(R7): A silicon oxide film having a thickness of 300 nm was formed by means of an LPCVD method.

(S21): The silicon oxide film formed by the method of (R7) was exposed for 30 seconds to the vapor of hexamethyl disilazane while heating the wafer at a temperature of 130° C.

(S22): The exposure time in (S21) was set to 60 seconds.
(S23): The exposure time in (S21) was set to 120 seconds.
(S24): The exposure time in (S21) was set to 180 seconds.
(S25): 10 g of a fluorine compound represented by the following formula (8) (n/m=1/1) and having a weight average molecular weight of 12,000 was dissolved in 90 g of perfluoroether to prepare a solution, which was then spin-coated on the surface of the lower film. Then, the coated layer was heated for 60 seconds at a temperature of 200° C., thereby forming an adhesion-promoting film.

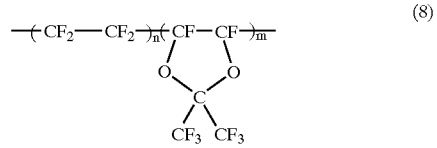
(8)

Thereafter, 8 g of polysiloxane represented by the following formula (9) and having an average molecular weight of 8,000 was dissolved in 92 g of isopropyl alcohol to prepare a solution for the intermediate film, which was then spin-coated on the surface of each of the lower films formed by the aforementioned methods. Then, the coated layer was baked for 120 seconds at a temperature of 300° C. by making use of a hot plate, thereby forming an intermediate film 5 having a thickness of 70 nm.

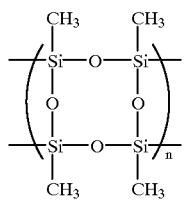
(9)

Then, as shown in FIG. 1D, a resist film 6 was formed on the intermediate film 5 in the same manner as employed in Example 1, and subjected to a patterning exposure to form a resist patter having 0.12 μm space as shown in FIG. 1E.

Thereafter, in the same method as employed in Example 1, the resist pattern 7 was transferred to the intermediate film 5 as shown in FIG. 1F to thereby form an intermediate film pattern 8.

Thereafter, as shown in FIG. 1G, the intermediate film pattern 8 was transferred to the lower film 3 to form a lower film pattern 9. In this case, the etching was performed under the conditions wherein a magnetron type reactive-ion etching apparatus was employed as an etching apparatus, a gas mixture of $CF_4/O_2/Ar$ (flow rate thereof: 20/20/100 sccm) was employed as a source gas, the excitation power density was set to 2 W/cm$^2$, the degree of vacuum was set to 40 mTorr, and the temperature of the substrate was set to 20° C.

As a result, as shown in FIG. 1G', as far as the lower film which was not subjected to hydrophobic treatment was concerned, the generation of voids could be recognized inside the intermediate film.

The results of investigations with regard to the contact angle of each of the lower film and the adhesion-promoting film to pure water as well as with regard to the number of voids generated inside the intermediate film are shown in the following Table 4. By the way, the contact angle of the intermediate film to pure water was as high as 89° and hence the intermediate film was high in hydrophobicity.

It will be seen from this Table 4 that the hydrophobicity of the lower film was enhanced by the exposure of the lower film to the vapor of hexamethyl disilazane or by the deposition of an adhesion-promoting film on the lower film.

In view of these facts, the reason for the reduction of void by the exposure of the lower film to the vapor of hexamethyl disilazane or by the deposition of an adhesion-promoting film can be attributed, to the facts that the hydrophobicity of the surface of the lower film was enhanced due to the exposure of the lower film to the vapor of hexamethyl disilazane or by the deposition of an adhesion-promoting film, thus making it possible to improve the adhesion between the lower film and the intermediate film exhibiting a high hydrophobicity.

TABLE 4

| Method of Forming lower Film | Contact angle [°] | Number of void |
|---|---|---|
| (R7) | 2 | 400 |
| (S21) | 52 | 12 |
| (S22) | 67 | 3 |
| (S23) | 76 | 2 |
| (S24) | 82 | 0 |
| (S25) | 88 | 0 |

As explained above, according to the present invention, since an adhesion-promoting treatment is applied to the surface of the lower film, or an adhesion-promoting film is formed on the lower film, the content of carbon atom in the lower film is increased, and hence the gas permeability thereof is lowered, so that even if a source gas or part thereof is allowed to stay between the lower film and the overlying etching mask on the occasion of etching the lower film, it is possible, due to a strong adhesion between the lower film and the etching mask, to prevent the etching mask from being voided or ruptured. Therefore, it is now possible to properly perform the processing of the lower film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern comprising the steps of;
   forming a lower film on a substrate, the lower film being a film containing carbon atom at a ratio of 80 wt % or more, or a vapor phase deposition film;
   applying an adhesion-promoting treatment to a surface of said lower film;
   forming an intermediate film on a surface of the lower film on which said adhesion-promoting treatment has been applied;
   forming a resist film on said intermediate film;
   forming a resist pattern by conducting a patterning exposure of said resist film;
   forming an intermediate film pattern by transferring said resist pattern to said intermediate film; and
   forming a lower film pattern by transferring said intermediate film pattern to said lower film.

2. The method according to claim 1, wherein said adhesion-promoting treatment is a treatment to increase the polarity of the surface of said lower film.

3. The method according to claim 2, wherein said treatment to increase the polarity of the surface of said lower film is a treatment to increase the polarity to such an extent that the contact angle of said surface of the lower film to pure water becomes not more than 20°.

4. The method according to claim 2, wherein said treatment to increase the polarity of the surface of said lower film is a treatment to irradiate an energy beam to said lower film.

5. The method according to claim 2, wherein said treatment to increase the polarity of the surface of said lower film is a treatment to expose said lower film to ozone.

6. The method according to claim 1, wherein said adhesion-promoting treatment is a treatment to decrease the polarity of the surface of said lower film.

7. The method according to claim 6, wherein said treatment to decrease the polarity of the surface of said lower film is a treatment to expose said lower film to an atmosphere containing the vapor of hexylmethyl disilane.

8. A method of forming a pattern comprising the steps of;
  forming a lower film on a substrate, the lower film being a film containing carbon atom at a ratio of 80 wt % or more, or a vapor phase deposition film;
  applying an adhesion-promoting treatment to a surface of said lower film;
  forming a resist film containing a metal atom or a semiconductor atom on a surface of the lower film on which said adhesion-promoting treatment has been applied;
  forming a resist pattern by conducting a patterning exposure of said resist film; and
  forming a lower film pattern by transferring said resist pattern to said lower film.

9. The method according to claim 8, wherein said adhesion-promoting treatment is a treatment to increase the polarity of the surface of said lower film.

10. The method according to claim 9, wherein said treatment to increase the polarity of the surface of said lower film is a treatment to increase the polarity to such an extent that the contact angle of said surface of the lower film to pure water becomes not more than 20°.

11. The method according to claim 9, wherein said treatment to increase the polarity of the surface of said lower film is a treatment to irradiate an energy beam to said lower film.

12. The method according to claim 9, wherein said treatment to increase the polarity of the surface of said lower film is a treatment to expose said lower film to ozone.

13. The method according to claim 8, wherein said adhesion-promoting treatment is a treatment to decrease the polarity of the surface of said lower film.

14. The method according to claim 13, wherein said treatment to decrease the polarity of the surface of said lower film is a treatment to expose said lower film to an atmosphere containing the vapor of hexylmethyl disilane.

15. The method according to claim 14, wherein the metal atom to be incorporated into said resist film is at least one kind of metal selected from the group consisting of aluminum, titanium, zirconium and tungsten.

16. The method according to claim 14, wherein the semiconductor atom to be incorporated into said resist film is at least one kind of atom selected from the group consisting of germanium and silicon.

17. A method of forming a pattern comprising the steps of;
  forming a lower film on a substrate, the lower film being a film containing carbon atom at a ratio of 80 wt % or more, or a vapor phase deposition film;
  forming an adhesion-promoting film on a surface of said lower film;
  forming an intermediate film on a surface of said adhesion-promoting film;
  forming a resist film on said intermediate film;
  forming a resist pattern by conducting a patterning exposure of said resist film;
  forming an intermediate film pattern by transferring said resist pattern to said intermediate film; and
  forming a lower film pattern by transferring said intermediate film pattern to said lower film.

18. The method according to claim 17, wherein said adhesion-promoting film is made of phenolic resin, novolac series resin or acrylic resin.

19. A method of forming a pattern comprising the steps of;
  forming a lower film on a substrate, the lower film being a film containing carbon atom at a ratio of 80 wt % or more, or a vapor phase deposition film;
  forming an adhesion-promoting film on a surface of said lower film;
  forming a resist film on a surface of said adhesion-promoting film;
  forming a resist pattern by conducting a patterning exposure of said resist film; and
  forming a lower film pattern by transferring said resist pattern to said lower film.

20. The method according to claim 19, wherein said adhesion-promoting film is made of phenolic resin, novolac series resin or acrylic resin.

* * * * *